US009070700B2

(12) United States Patent
Haralabidis et al.

(10) Patent No.: US 9,070,700 B2
(45) Date of Patent: Jun. 30, 2015

(54) APPARATUS FOR ELECTROSTATIC DISCHARGE PROTECTION AND NOISE SUPPRESSION IN CIRCUITS

(75) Inventors: Nikolaos Haralabidis, Athens (GR); Ioannis Kokolakis, Holargos (GR)

(73) Assignee: Broadcom Corporation, Irvine, CA (US)

( * ) Notice: Subject to any disclaimer, the term of this patent is extended or adjusted under 35 U.S.C. 154(b) by 74 days.

(21) Appl. No.: 13/435,530

(22) Filed: Mar. 30, 2012

(65) Prior Publication Data

US 2013/0114171 A1  May 9, 2013

Related U.S. Application Data

(60) Provisional application No. 61/556,094, filed on Nov. 4, 2011.

(30) Foreign Application Priority Data

Mar. 22, 2012  (GR) .................................. 120100169

(51) Int. Cl.
| | |
|---|---|
| *H02H 3/20* | (2006.01) |
| *H01L 23/60* | (2006.01) |
| *H02H 9/04* | (2006.01) |
| *H01L 27/02* | (2006.01) |
| *H01L 25/00* | (2006.01) |
| *H01L 23/00* | (2006.01) |

(52) U.S. Cl.
CPC ................. *H01L 23/60* (2013.01); *H01L 25/00* (2013.01); *H02H 3/20* (2013.01); *H02H 9/04* (2013.01); *H01L 2224/131* (2013.01); *H01L 2224/16225* (2013.01); *H01L 2224/48227* (2013.01); *H01L 2924/14* (2013.01); *H01L 2224/48091* (2013.01); *H01L 24/13* (2013.01); *H01L 24/16* (2013.01); *H01L 24/48* (2013.01); *H01L 27/0255* (2013.01); *H01L 27/0292* (2013.01)

(58) Field of Classification Search
CPC . H01L 23/60; H01L 27/0292; H01L 27/0251; H01L 25/00; H02H 3/20; H02H 9/04
USPC ........... 361/56, 91.1, 91.5, 111; 257/207, 691
See application file for complete search history.

(56) References Cited

U.S. PATENT DOCUMENTS

| | | | | |
|---|---|---|---|---|
| 5,453,713 | A * | 9/1995 | Partovi et al. .................. | 327/565 |
| 5,459,634 | A * | 10/1995 | Nelson et al. .............. | 361/306.3 |
| 6,732,428 | B1 * | 5/2004 | Kwong ........................... | 29/832 |
| 7,339,445 | B2 * | 3/2008 | Aigner et al. ................. | 333/133 |
| 7,593,202 | B2 * | 9/2009 | Khazhinsky et al. .......... | 361/56 |
| 2005/0161798 | A1 * | 7/2005 | Ninomiya et al. ............ | 257/690 |

(Continued)

*Primary Examiner* — Zeev V Kitov

(74) *Attorney, Agent, or Firm* — Sterne, Kessler, Goldstein & Fox P.L.L.C.

(57) ABSTRACT

An integrated circuit assembly is provided that includes an integrated circuit (IC) package substrate including a package ground rail that is divided into a plurality of segments that are electrically isolated from each other. An IC die is disposed on the IC package substrate, the IC die including a plurality of circuit blocks and an IC ground rail. The IC ground rail is divided into a plurality of segments, where each segment of the IC ground rail is coupled to another segment of the IC ground rail by one or more diodes. The plurality of circuit blocks have corresponding ground nodes electrically connected to corresponding segments of the IC ground rail. The segments of the IC ground rail are electrically coupled to corresponding segments of the package ground rail by corresponding first connections.

19 Claims, 7 Drawing Sheets

(56) References Cited

U.S. PATENT DOCUMENTS

| | | | |
|---|---|---|---|
| 2009/0283898 A1* | 11/2009 | Janzen et al. | 257/698 |
| 2011/0013353 A1* | 1/2011 | Kwon et al. | 361/679.31 |
| 2011/0057291 A1* | 3/2011 | Slupsky et al. | 257/531 |
| 2012/0033335 A1* | 2/2012 | Wang et al. | 361/56 |
| 2012/0069478 A1* | 3/2012 | Caplan et al. | 361/56 |
| 2012/0162832 A1* | 6/2012 | Wang et al. | 361/56 |
| 2012/0326335 A1* | 12/2012 | Dedic et al. | 257/778 |

\* cited by examiner

APPARATUS FOR ELECTROSTATIC DISCHARGE PROTECTION AND NOISE SUPPRESSION IN CIRCUITS

CROSS-REFERENCE TO RELATED APPLICATIONS

This patent application claims the benefit of U.S. Provisional Patent Application No. 61/556,094, filed Nov. 4, 2011, entitled "Long Term Evolution Radio Frequency Integrated Circuit," which is incorporated herein by reference in its entirety.

FIELD OF THE INVENTION

The present application is directed to an electronic device with electrostatic discharge (ESD) and interference suppression.

BACKGROUND

Background Art

Conventional techniques to provide electrostatic discharge (ESD) protection in electronic devices and conventional techniques to mitigate electronic interference are insufficient. Therefore, there is a need to provide ESD techniques with improved ESD protection, and to reduce electronic interference from both internal and external sources.

SUMMARY

The present disclosure provides an electronic device with electrostatic discharge (ESD) protection, and suppression of electronic interference and noise. The ESD configuration can be used in integrated circuits configured for system-on-chip (SoC) and system-in-package (SiP) implementations, and provides increased ESD protection over conventional techniques. Further, electronic interference from both internal and external sources is reduced with respect to the integrated circuits included in the SoC and SiP implementations.

In one aspect of the disclosure, an integrated circuit (IC) includes a first functional block connected to a dedicated first ground connection within the IC, a second functional block connected to a dedicated second ground connection within the IC, wherein the first ground connection and the second ground connection are electrically isolated from each other during a normal operation of the IC, where normal operation excludes an ESD event.

In another aspect of the disclosure, an integrated circuit assembly includes an integrated circuit (IC) package substrate including a package ground rail that is divided into a plurality of segments that are physically separate from each other. An IC die is disposed on the IC package substrate, the IC die including a plurality of circuit blocks and an IC ground rail that encompasses the plurality of circuits. The IC ground rail is divided into a plurality of segments, where each segment of the IC ground rail is coupled to another segment of the IC ground rail by one or more diodes. The plurality of circuit blocks have corresponding ground nodes electrically coupled to corresponding segments of the IC ground rail. Further, the segments of the IC ground rail are coupled to corresponding segments of the package ground rail by corresponding first electrical connections that could be, for example: wirebonds, solder bumps, solder balls, and the like. In a further aspect of the disclosure, the IC package substrate is disposed on a support substrate, such as a PC board, having a support ground rail, where the segments of the package ground rail are coupled to the support ground rail by corresponding second electrical connections that could be, for example, wirebonds, solder bumps, solder balls, and the like.

BRIEF DESCRIPTION OF THE DRAWINGS/FIGURES

DETAILED DESCRIPTION

Conventional integrated circuits included in SoC/SiP configurations have poor ESD protection and poor interference suppression for the following reasons.

Figure 1:
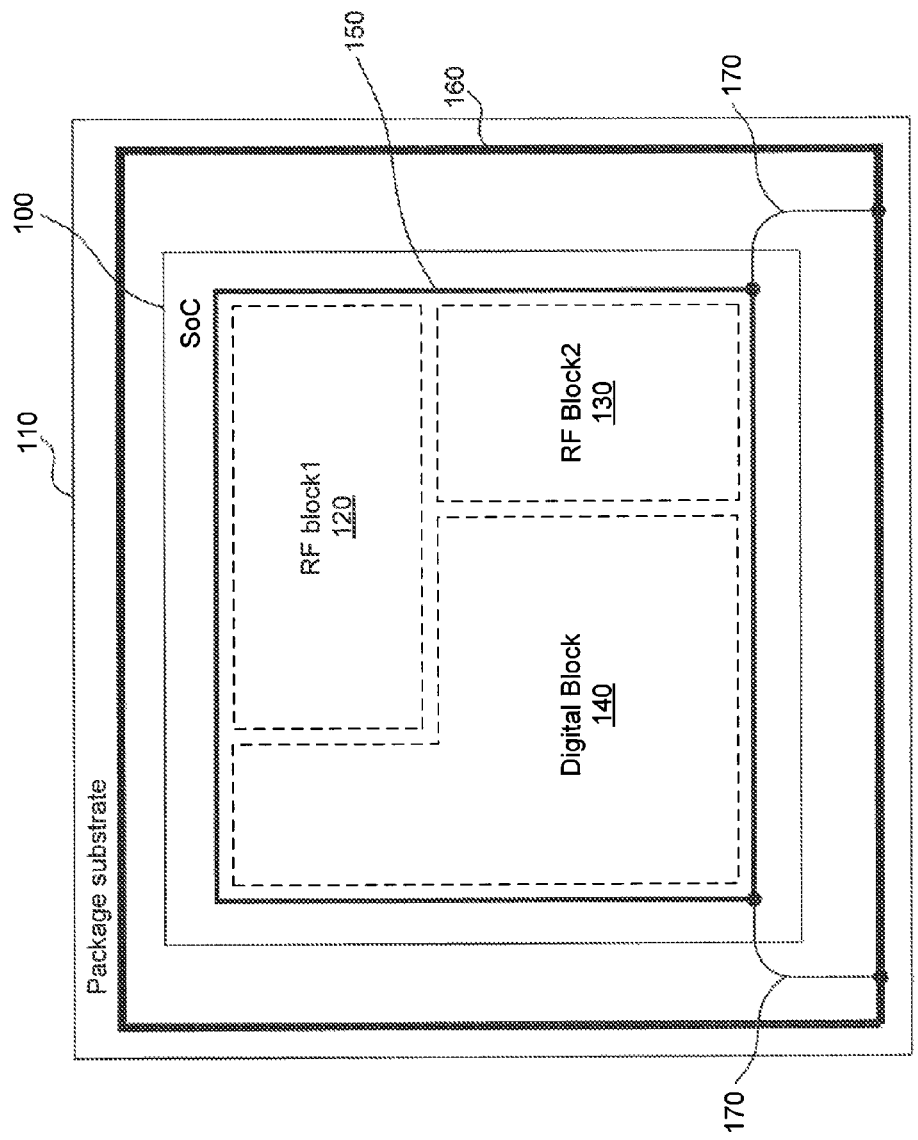
FIG. 1 illustrates a conventional system-on-chip (SoC) encapsulated in a package substrate.

FIG. 1 shows a conventional SoC 100 encapsulated in a package substrate 110. The SoC 100 includes functional blocks including an RF block1 120, an RF block2 130, and a digital block 140. Further, the SoC 100 includes a single SoC common ground rail 150 that is shared by the functional blocks 120, 130, 140 included in SoC 100. The package substrate 110 includes a single package common ground rail 160. The SoC common ground rail 150 is connected to the package common ground rail 160 via a plurality of electrical connections 170 that can be any of, but not limited to: wirebonds, solder bumps, solder balls, and the like.

As an example of SoC 100, the RF block1 120 can include a transmitter block including transmission circuitry, RF block2 130 is a receiver block including reception circuitry, and the digital block 140 includes at least a processor and memory circuitry. In the conventional SoC 100, there is a single common ground rail 150 that is shared by all the functional blocks 120, 130, 140. That is, all the respective ground (VSS) connections associated with the circuitry within the respective blocks 120, 130, 140 are connected to the single common ground rail 150 of the SoC 100. The SoC common ground rail 150 is connected to the package common ground rail 160 through a plurality of electrical connections 170.

Now, the SoC common ground is provided to ensure a solid return path for ESD protection. To dissipate the high current and high voltage spikes seen during an ESD event, low-resistance paths are required to connect the SoC common ground rail 150 to the package common ground rail 160, and also to connect the respective ground (VSS) connections to the SoC common ground rail 150.

Figure 2:
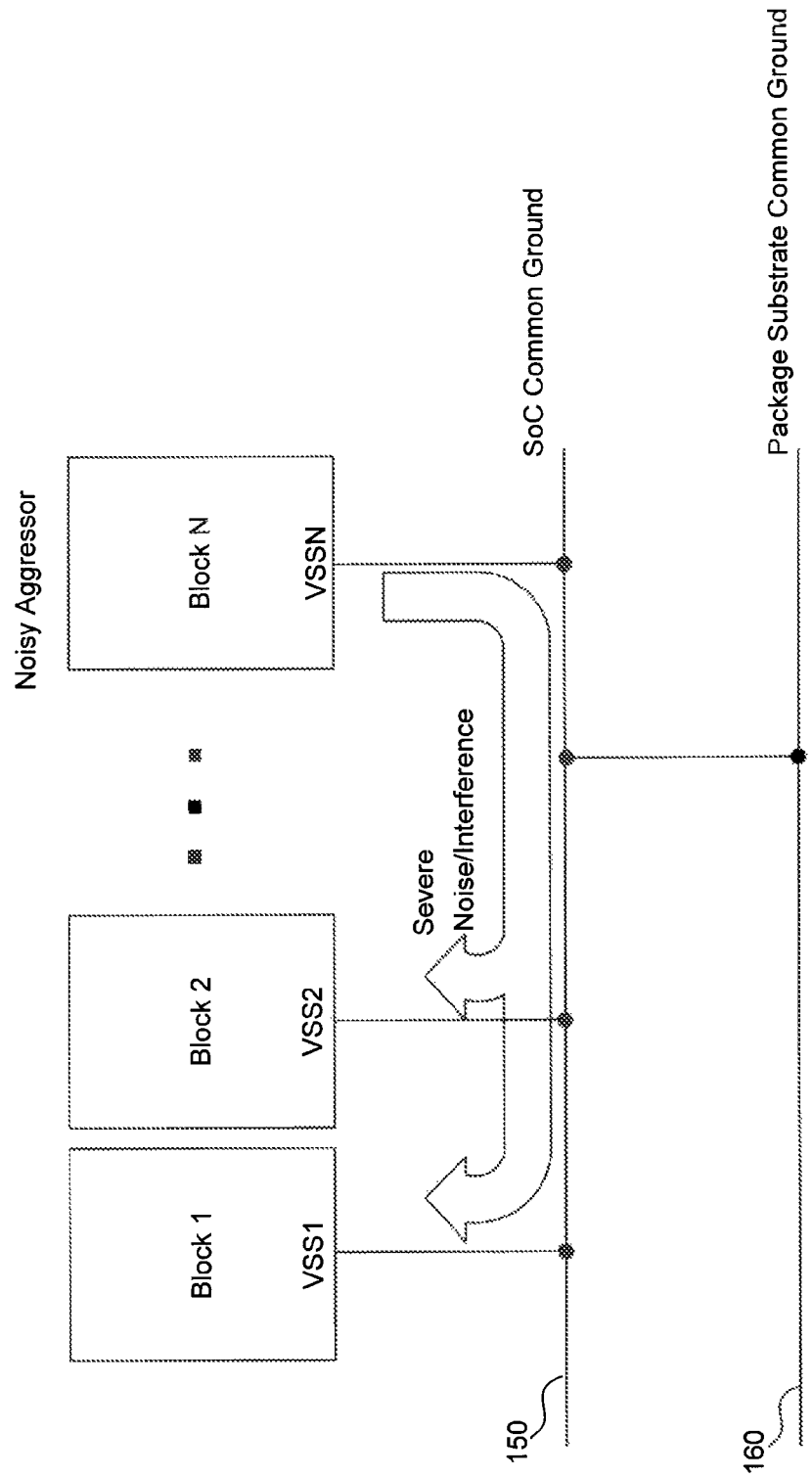
FIG. 2 illustrates the propagation of interference in a conventional SoC.

However, the SoC 100 suffers from interference from internal and external sources. In particular, because all respective ground (VSS) connections share the same common ground rail 150, there is severe noise coupling and interference propagation from a block that generates a significant amount of noise to other neighboring blocks through the shared common ground rail 150. For example, clocking noise from digital block 140 can infiltrate the RF block1 120 and the RF block2 130. This interference effect is illustrated in FIG. 2. For example, when block 1, block 2, . . . block N of an SoC share the SoC common ground 150, noise and interference from the noisy aggressor block N is propagated to the other blocks of the SoC through the shared common ground 150. This interference is undesirable.

Figure 3:
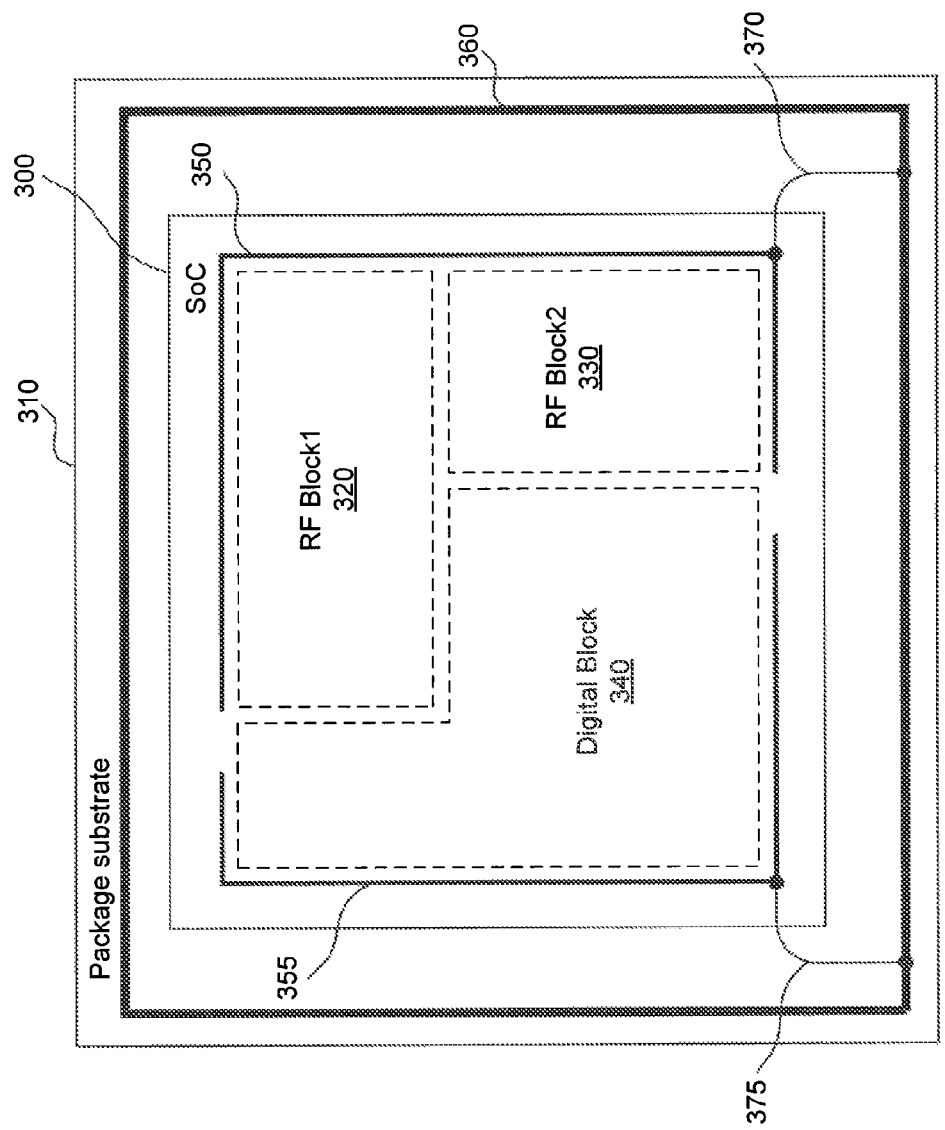
FIG. 3 illustrates another conventional SoC encapsulated in a package substrate.

FIG. 3 shows another conventional SoC 300 encapsulated in a package substrate 310. The SoC 300 is similar to the SoC 100 shown in FIG. 1, except that the SoC 300 includes segmented ground rails 350, 355. The SoC 300 also includes RF block1 320, RF block2 330, and digital block 340 similar to SoC 100. The package substrate 310 includes a package common ground rail 360, and the segmented SoC ground rails 350, 355 are independently connected to the package common ground rail 360 via separate connections 370, 375 respectively.

In the SoC 300, the ground rail is segmented into ground rails 350, 355 to minimize interference from a noisy aggressor block to other blocks on the SoC. In particular, known noisy aggressor blocks like the digital block 340 are connected to segmented ground rail 355, and are thereby isolated from another block like the RF blocks ½ which are susceptible to noise/interference and are connected to segmented ground rail 350. Further, the ESD protection in SoC 300 suffers from lack of a low-resistance conductive return path. This is because any ESD spike occurring in any of the functional blocks is required to travel along the high-resistance wirebond connections out of the SoC, through the package substrate ground 360, and then back to the SoC along the high-resistance wirebond connections, which reduces ESD performance.

Figure 4:
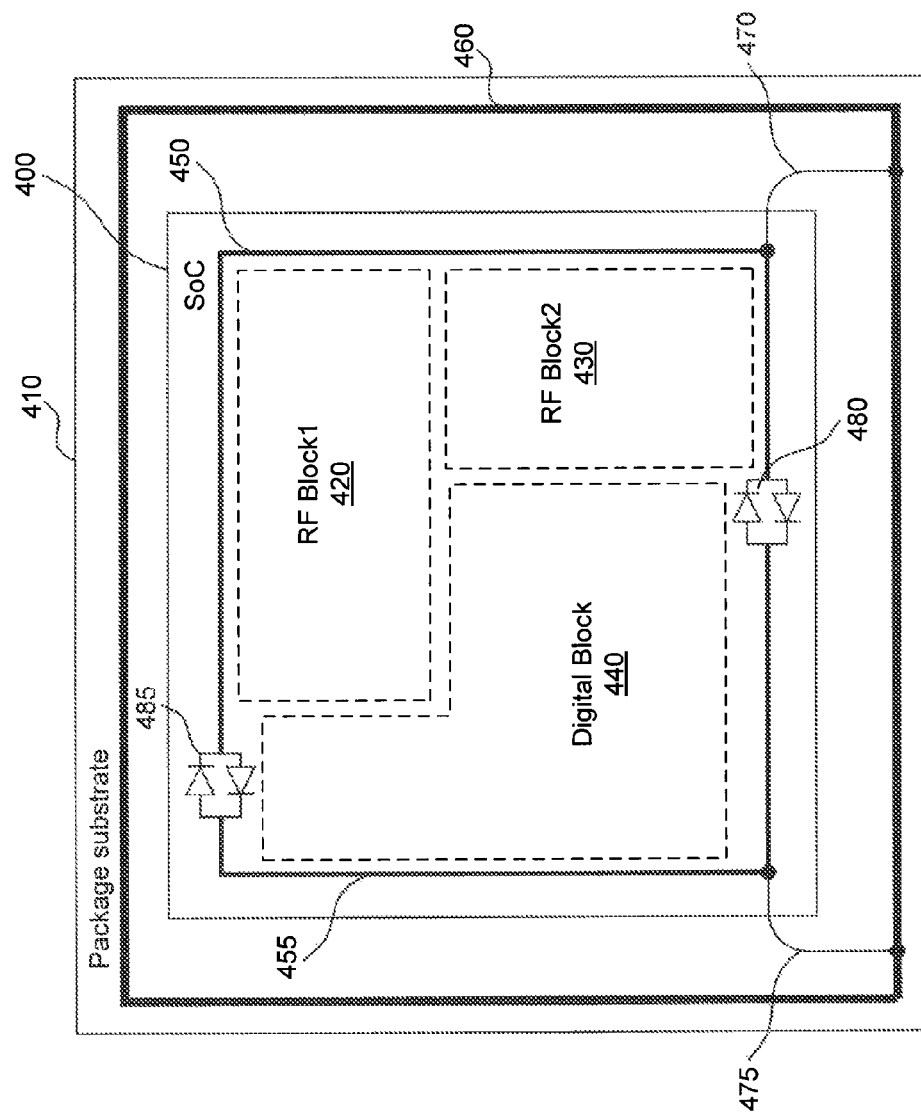
FIG. 4 illustrates another conventional SoC encapsulated in a package substrate.

FIG. 4 shows another conventional SoC 400 encapsulated in a package substrate 410. The SoC 400 is similar to SoC 300, in that SoC 400 includes an RF block1 420, an RF block2 430, a digital block 440, and segmented SoC ground rails 450, 455 that are connected to the package substrate common ground 460 through separate electrical connections 470, 475 respectively. For better ESD performance, the SoC 400 includes anti-parallel diodes 480, 485 which connect together the segmented SoC ground rails 450, 455. In particular, when there is an ESD event in any of the blocks 420, 430, 440 of the SoC, the anti-parallel diodes become operational and connect the segmented ground rails 450, 455. As such, the ESD spikes from any blocks 420, 430, 440 travel through the segmented ground rails and through the anti-parallel diodes. For example, an ESD spike in RF block1 420 with respect to digital block 440, travels through segmented ground rail 450, and through anti-parallel diodes 480 to the ground rail 455. In this way, the complete return path of the ESD spikes lies within the SoC, thereby ensuring ESD performance. However, the conventional SoC 400 suffers from interference. This is because noise/interference from a block of the SoC propagates to another block of the SoC through the segmented ground rails 450, 455 and through the package substrate common ground 460 via connections 470, 475. In particular, noise/interference from a noisy digital block 440 propagates through the segmented ground rail 455, through connections 475, through the package substrate common ground 460, through connections 470, and through the segmented ground rail 450 to the RF block2 430. Therefore, the design of the conventional SoC 400 suffers from poor interference suppression.

Figure 5:
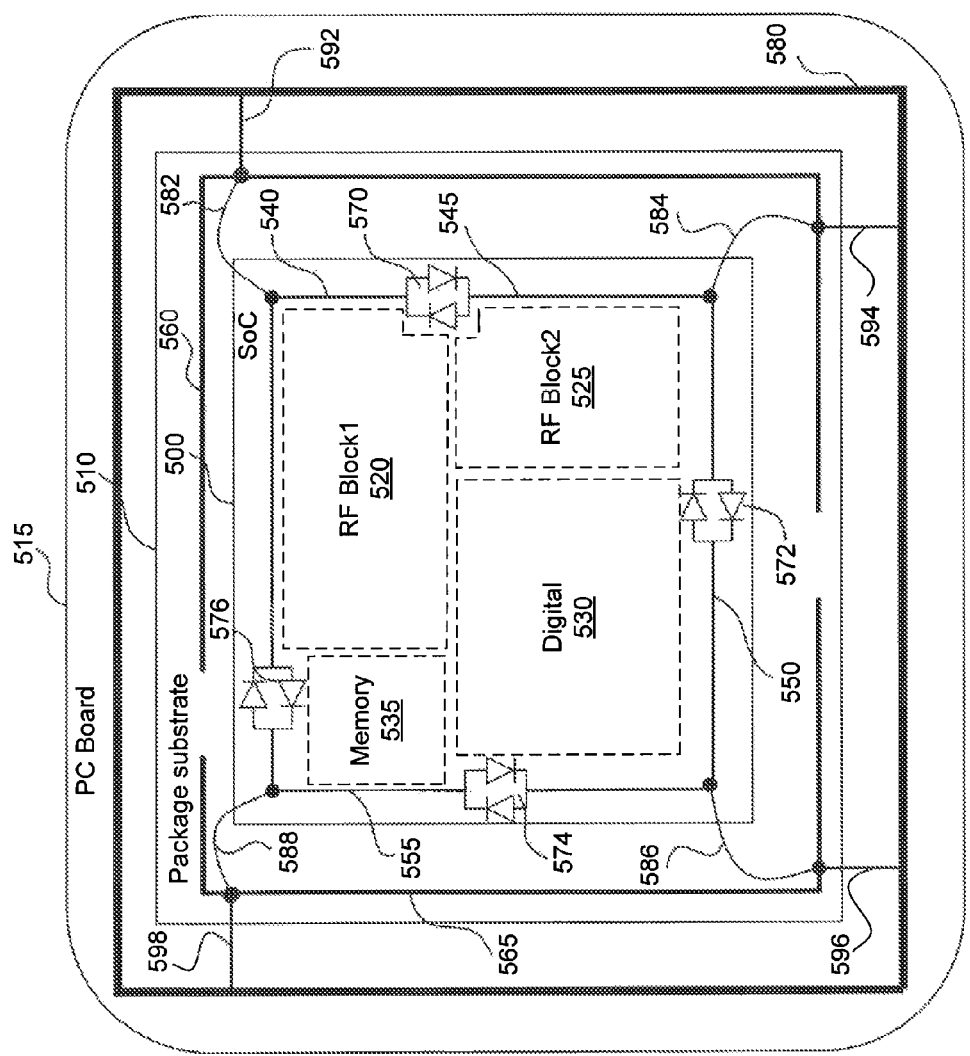
FIG. 5 illustrates an exemplary SoC according to an embodiment of the present disclosure.

FIG. 5 shows an exemplary embodiment of SoC 500 according to an embodiment of the present disclosure. The SoC 500 is encapsulated in the package substrate 510, which is placed on and/or connected to a printed circuit (PC) board 515. The SoC 500 includes RF block1 520, RF block2 525, digital block 530, and memory block 535. The SoC 500 also includes segmented ground rails 540, 545, 550, 555 that are connected to respective ground node of the RF block1 520, RF block2 525, digital block 530, and memory block 535. For example, RF block1 520 has a ground node that is connected to ground rail 540; RF block2 525 has a ground node that is connected to ground rail 545; etc. In an embodiment, the ground node of a particular circuit block is exclusively connected to its particular IC segmented ground rail, without being connected to any other, at least at the IC chip level.

The segmented ground rails 540, 545, 550, 555 are connected to each other via anti-parallel diodes 570, 572, 574, 576. The segmented ground rails 540, 545, 550, 555 are also connected to segmented package ground rails 560, 565 through connections 582, 584, 586, 588 respectively. Finally, the segmented package ground rails 560, 565 are connected to the PC board common ground rail 580 through connections 592, 594, 596, 598. The PC board is substrate, different from the package substrate, that provides mechanical support and connection to (earth) ground via its common ground rail 580. The assembly including the SoC 500 and package substrate, with or without the PC board may be referred as an IC assembly, or electronic device, as will be understood by those skilled in the arts.

As discussed above, in the SoC 500, each block 520, 525, 530, 535 is provided with a respective segmented ground rail 540, 545, 550, 555. That is, the blocks 520, 525, 530, 535 are isolated from each other with respect to the segmented ground rails 540, 545, 550, 555 which the blocks are respectively connected to. Further, the segmented ground rails 540, 545, 550, 555 are interconnected using anti-parallel diodes 570, 572, 574, 576, which conduct during an ESD event and provide a low resistance conduction path for ESD spikes within the SoC 500. This interconnection ensures that the return path for any ESD spike in a functional block of the SoC 500 stays within the SoC 500, and is not degraded by the high resistances of the connections. This occurs because the segmented ground rails are metal conductors having a lower resistance than that of the connections to the package substrate ground rail.

For example, if an ESD spike occurs in the RF block1 520 with respect to the digital block 530, then the ESD spike travels through segmented ground rail 540, through anti-parallel diodes 570, through segmented ground rail 545, and through anti-parallel diodes 572 to the ground rail 550. Therefore, by staying within the SoC solution 500, a solid return path for any ESD event is ensured without relying on high-resistance connections. Therefore, the segmented ground rails 540, 545, 550, 555 are isolated from each other via the anti-parallel diodes, and arranged so that each segmenting ground rail is dedicated to a corresponding block of the SoC. Further, since the anti-parallel diodes conduct for an ESD event, the return path for any ESD event lies within the SoC through the use of anti-parallel diodes and ground rails, thereby improving the ESD solution.

In addition, the interference suppression is improved by isolating the segmented ground rails 540, 545, 550, 555. In particular, the segmented ground rails 540, 545, 550, 555 are connected to the segmented package substrate ground rails 560, 565 respectively via connections 582, 584, 586, 588. In one embodiment, the noisy blocks 530, 535 of the SoC 500 may be connected to one of the segmented package substrate ground rails 565 through their respective segmented ground rails 550, 555, and the sensitive blocks 520, 525 of the SoC that are susceptible to noise interference may be connected to another one of the segmented package substrate ground rails 560 through their respective segmented ground rails 540, 545. Further, the segmented package substrate ground rails 560, 565 are connected to the PC board common ground rail 580 through PC board connections 592, 594, 596, 598. The PC board ground rail 580 is a metal conductor having a lower resistance than that of the corresponding connections.

Due to the above connection configuration, any noise that originates from a noisy block 530 does not propagate to another block 520,525 via the segmented ground rails 540, 545, 550, 555 because the anti-parallel diodes conduct only during an ESD event. As such, the noise from a noisy block 530 is forced to travel through segmented ground rail 550, through connection 586 to segmented package substrate ground rail 565, through PC board connections 596, 598 to the PC board common ground rail 580, through PC board connections 592, 594 to segmented package substrate ground rail 560, and through connection 582 to segmented ground rail 540 to the noise susceptible RF block1 520. It is desirable to force the noise interference to travel through the package substrate ground rails and/or the PC board common ground rail. This is because the extremely low resistance to (earth) ground of the PC board ground rail 580 relative to that of the connections, assists greatly in attenuating the noise/interference travelling through the same. Therefore, even if any noise/interference reaches the noise susceptible block 520, this noise/interference is highly attenuated. In this way, the above connection configuration enables minimization of noise/interference propagation. The travel path for the noise/interference is illustrated in FIG. 6, discussed below.

One skilled in the art will appreciate that the above segmentation and connection configuration is exemplary, and that any number of segmentations of the respective ground rails to improve the ESD protection and the reduction of interference propagation is possible within the scope of the present disclosure. Further, one skilled in the art will appreciate that the scope of the present disclosure includes more than one SoC solution, with its own respective blocks and segmented ground rails, being encapsulated in one or more package substrate.

Figure 6:
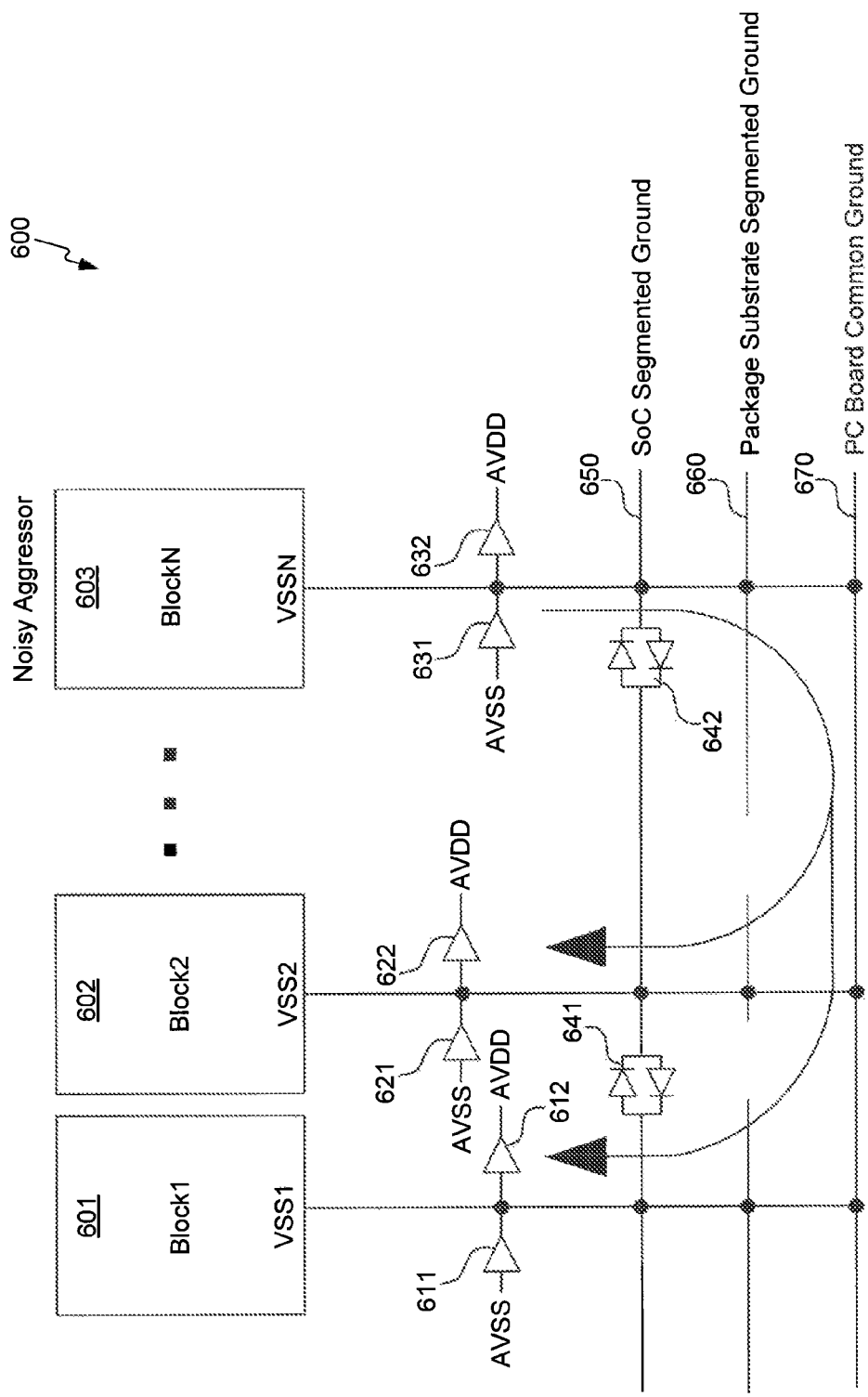
FIG. 6 illustrates an exemplary layout configuration of a SoC with interference propagation according to an embodiment of the present disclosure.

FIG. 6 illustrates an exemplary layout configuration of a SoC 600 according to an embodiment of the present disclosure. SoC 600 includes "N" blocks 601, 602, 603 having respective ground connections VSS1, VSS2, VSSN. Ground connection VSS1 is provided with (ESD) protection diodes 611, 612. Ground connection VSS2 is provided with (ESD) protection diodes 621, 622. Ground connection VSS3 is provided with (ESD) protection diodes 631, 632. Further, each ground connection VSS1, VSS2, VSSN is connected to its respective SoC segmented ground rail 650, to its respective segmented package ground rail 660, and to the PC board common ground rail 670. The individual ground connections can be alternatively be connected directly to the PC board ground rail 670. The SoC segmented ground rails 650 are connected to each other via anti-parallel diodes 641, 642.

In this way, the noise/interference from a noisy aggressor block 603 does not propagate to noise susceptible blocks 601, 602 through the SoC ground rail 650 because of the segmentations. In particular, this is because the anti-parallel diodes do not conduct in the absence of an ESP event. As such, the noise/interference from the noisy aggressor block is forced to travel through at least the low resistance PC board common ground rail 670 that is connected to (earth) ground, where the interference is greatly attenuated, before reaching the noise susceptible blocks 601, 602, as discussed above. Therefore, the exemplary connection and layout configuration shown in FIG. 6 enables minimization of interference at noise susceptible blocks 601, 602 from noisy aggressor blocks 603.

In another embodiment, the PC board common ground rail 670 can also be segmented, the segments respectively being connected to noisy aggressor blocks and to noise susceptible blocks. The segmented PC board ground rails may be connected to each other using inductive paths. This configuration allows a low reactance path to be used for DC operation of the system, and a high reactance path for noise/interference which may include high frequency currents. In this way, the present disclosure provides further isolation between the noise susceptible blocks and the noisy aggressor blocks.

Figure 7:
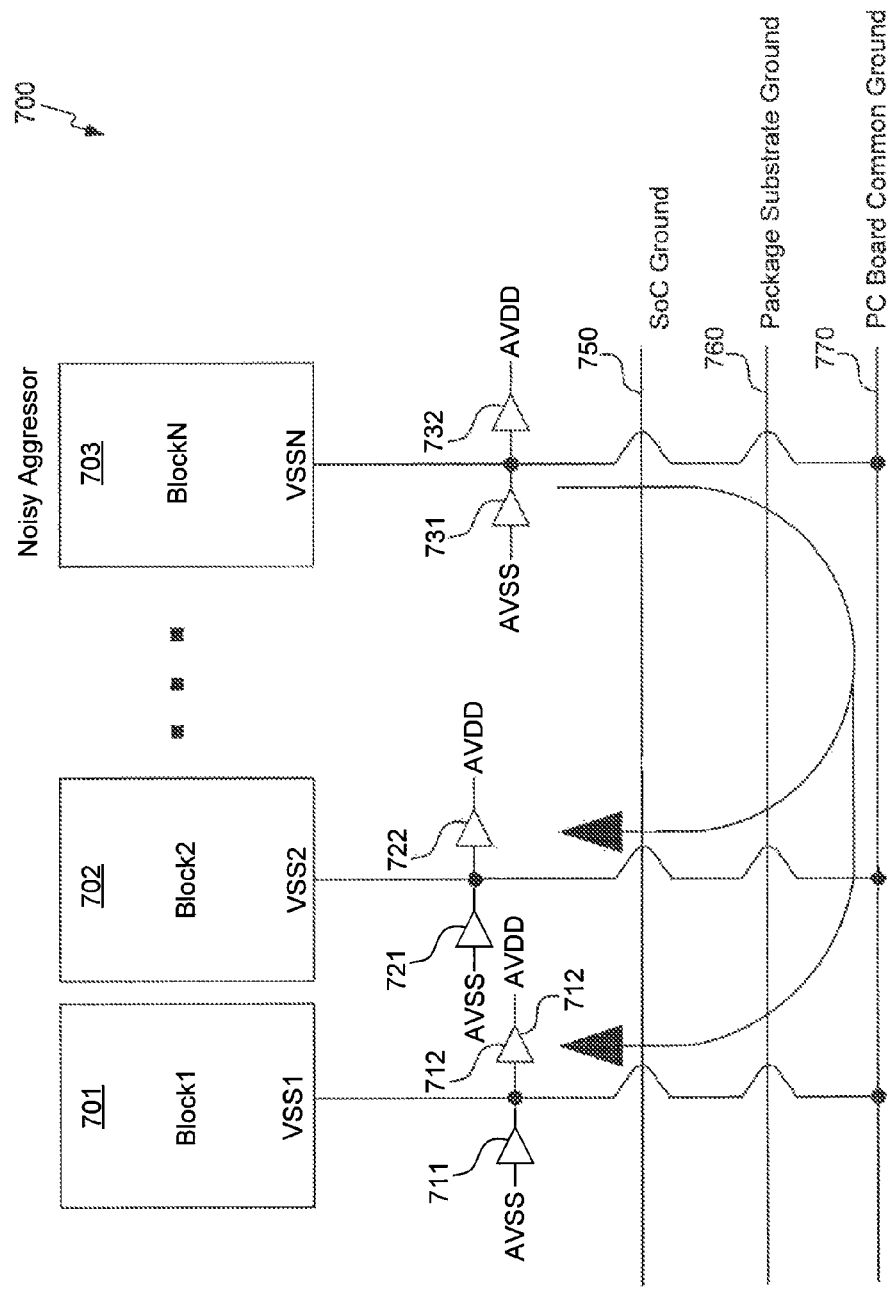
FIG. 7 illustrates another exemplary layout configuration of a SoC with interference propagation according to an embodiment of the present disclosure.

FIG. 7 shows another embodiment of a SoC solution 700 according to another embodiment of the present disclosure. Similar to the SoC solution 100 shown in FIG. 1, SoC solution 700 has a solid (un-segmented) ground rail 750. Further, SoC solution 700 includes "N" blocks 701, 702, 703 having respective ground connections VSS1, VSS2, VSSN. Each ground connection VSS1, VSS2, VSSN is provided with respective protection diodes: (711, 712) for VSS1, (721, 722) for VSS2, and (731, 732) for VSSN. The solid ground rail 750 can be connected to the PC board common ground rail 770. Further, each block ground connection VSS1, VSS2, VSSN is directly connected to the PC board common ground rail 770. Alternatively or additionally, each block ground connection may be directly connected to the package substrate ground 760 of the package that encapsulated the SoC solution 700. The AVSS connection of the diodes 711, 721, 731, is typically considered to be the SoC Ground 750, ensuring this way a robust ESD protection.

In this embodiment, the individual block ground connections are not connected to the SoC common ground rail 750, thereby preventing short direct connections from one block of the SoC solution to another. This isolates the individual block ground connections VSS1, VSS2, VSSN from each other, and forces any noise/interference from the noisy aggressor block 703 to be directed to the PC board common ground 770. Since the PC board common ground has very low resistance that is connected to (earth) ground, any noise/interference traveling through it is highly attenuated. As such, even if this noise/interference propagates to the noise susceptible blocks 701, 702, it is highly attenuated and any damaging effects of the same are minimized.

The above embodiment realizes the design of a grounding scheme on a SoC solution 700 encapsulated in a package (not shown) that minimizes the noise/interference coupling and propagation within the SoC solution 700. The interference from internal and external sources is minimized due to the above described configuration that involves a proper isolation of the individual block ground connections VSS1, VSS2, VSSN from each other within the SoC solution 700.

CONCLUSION

It is to be appreciated that the Detailed Description section, and not the Summary and Abstract sections, is intended to be used to interpret the claims. The Summary and Abstract may set forth one or more but not all exemplary embodiments of the present disclosure, and thus, are not intended to limit the present disclosure or the appended claims in any way.

The present disclosure has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present disclosure should not be limited by any of the above-described exemplary embodiments. Further, the invention(s) should be defined only in accordance with the following claims and their equivalents.

What is claimed is:

1. An integrated circuit (IC) assembly, comprising:
   an IC package substrate including a package ground rail having a plurality of segments that are physically separated from each other;
   an IC die disposed on the IC package substrate, the IC die including,
      an IC ground rail having a plurality of segments, each segment of the IC ground rail coupled to another segment of the IC ground rail by one or more diodes, and each segment of the IC ground rail coupled to a corresponding segment of the package ground rail by a corresponding first connection; and
      a plurality of circuit blocks, each having a corresponding ground node electrically coupled to a corresponding segment of the IC ground rail; and
   a support substrate having a support ground rail, wherein the IC package substrate is disposed on the support substrate, and each segment of the package ground rail is electrically coupled to the support ground rail by a corresponding second connection;
   wherein at least one segment of the IC ground rail is a metal conductor having a lower resistance than that of the first connection.

2. The IC assembly of claim 1, wherein the one or more diodes include a pair of anti-parallel diodes.

3. The IC assembly of claim 2, wherein the anti-parallel diodes are configured to conduct during an electrostatic discharge (ESD) event.

4. The IC assembly of claim 1, wherein the IC package is configured to include a plurality of ICs which include respective blocks and corresponding ground nodes.

5. The IC assembly of claim 1, wherein an interference signal from a first circuit block of the plurality of circuit blocks passes through the support ground rail before reaching a second functional block of the plurality of circuit blocks.

6. The IC assembly of claim 1, wherein the one or more diodes are configured to conduct during an electrostatic discharge (ESD) event.

7. The IC assembly of claim 1, wherein the one or more diodes are configured to remain open-circuited when stimulated by electronic noise generated by one or more of the plurality of circuit blocks, absent an ESD event.

8. The IC assembly of claim 1, wherein the support ground rail is a metal conductor having a lower resistance than that of the second connection.

9. The IC assembly of claim 1, wherein the plurality of segments in the package ground rail are electrically isolated from each other in the IC package substrate.

10. An integrated circuit (IC) assembly, comprising:
    a support substrate having a support ground rail, the support ground rail comprising a plurality of segments that are physically separated from each other;
    an IC package substrate disposed on the support substrate, the IC package substrate including a package ground rail of segments that are physically separated from each other and each segment of the package ground rail being electrically coupled to a corresponding support ground rail segment by a corresponding first connection; and
    an IC die disposed on the IC package substrate, the IC die including an IC ground rail having a plurality of segments, each segment of the IC ground rail being coupled to another segment of the IC ground rail by one or more diodes, and each segment of the IC ground rail being coupled to a corresponding segment of the package ground rail by a corresponding second connection;
    wherein the plurality of support ground rail segments are not connected by a common ground rail.

11. The IC assembly of claim 10, wherein the IC die further comprises:
    a plurality of circuit blocks, each circuit block having a corresponding ground node electrically coupled to a corresponding segment of the IC ground rail.

12. The IC assembly of claim 10, wherein the plurality of segments in the package ground rail are electrically isolated from each other in the IC package substrate.

13. The IC assembly of claim 10, wherein the one or more diodes are configured to conduct during an electrostatic discharge (PSI)) event.

14. The IC assembly of claim 10, wherein the one or more diodes comprise a pair of anti-parallel diodes.

15. The IC assembly of claim 10, wherein the plurality of support ground rail segments are electrically coupled by corresponding inductive paths.

16. The IC assembly of claim 15, wherein the inductive paths have low reactance for direct current (DC) signals and high reactance for high frequency signals.

17. An integrated circuit (IC) assembly, comprising:
    a support substrate having a support ground rail;
    an IC package substrate disposed on the support substrate, the IC package substrate including a package ground rail;
    an IC die disposed on the IC package substrate, the IC die including,
       an IC ground rail; and
       a plurality of circuit blocks, each having a corresponding ground node directly connected to the package ground rail, and wherein at least one ground node is not directly connected to the IC, ground rail.

18. The IC assembly of claim 17, where the plurality of ground nodes are connected to respective protection diodes.

19. The IC assembly of claim 17, wherein the package ground rail is connected to the support ground rail.

* * * * *

UNITED STATES PATENT AND TRADEMARK OFFICE
CERTIFICATE OF CORRECTION

PATENT NO. : 9,070,700 B2
APPLICATION NO. : 13/435530
DATED : June 30, 2015
INVENTOR(S) : Haralabidis et al.

It is certified that error appears in the above-identified patent and that said Letters Patent is hereby corrected as shown below:

On the title page item (30), replace "120100619" with --20120100169--.
In the claims
Column 7, lines 53-54, claim 4, replace "respective blocks" with --respective circuit blocks--.
Column 8, line 37, claim 13, replace "(PSI))" with --(ESD)--.
Column 8, line 57, claim 17, replace "IC, ground" with --IC ground--.
Column 8, line 58, claim 18, replace "where" with --wherein--.

Signed and Sealed this
Twenty-ninth Day of March, 2016

Michelle K. Lee
*Director of the United States Patent and Trademark Office*